US006717462B2

(12) United States Patent
Loheit et al.

(10) Patent No.: US 6,717,462 B2
(45) Date of Patent: Apr. 6, 2004

(54) QPSK AND 16 QAM SELF-GENERATING SYNCHRONOUS DIRECT DOWNCONVERSION DEMODULATOR

(75) Inventors: Kurt Loheit, Rolling Hills Estates, CA (US); James D. Cooper, Torrance, CA (US); Leah N. Burk, Redondo Beach, CA (US); Suzanne E. Kubasek, El Segundo, CA (US)

(73) Assignee: The Boeing Company, Chicago, IL (US)

( * ) Notice: Subject to any disclaimer, the term of this patent is extended or adjusted under 35 U.S.C. 154(b) by 64 days.

(21) Appl. No.: 10/123,574

(22) Filed: Apr. 15, 2002

(65) Prior Publication Data

US 2003/0193365 A1 Oct. 16, 2003

(51) Int. Cl.[7] .................................................. H03D 3/00
(52) U.S. Cl. ....................... 329/304; 329/306; 329/307; 329/308; 375/340; 375/326; 375/327; 375/329; 375/324
(58) Field of Search ................................. 375/340, 326, 375/327, 329, 324; 329/304, 306, 307, 308

(56) References Cited

U.S. PATENT DOCUMENTS 5,457,713 A * 10/1995 Sanderford, Jr. et al. ... 375/206
6,163,208 A * 12/2000 Christensen et al. ........ 329/304
6,366,622 B1 * 4/2002 Brown ........................ 375/322

FOREIGN PATENT DOCUMENTS

JP 2003078393 * 3/2003

OTHER PUBLICATIONS

Ball "Simulation of Acquisition in phase–locked loops incorporating phase–frequency detectors" IEEE International Symposisum on Circuits & Systems Jun. 11–14, 1991 pp. 2613–2616.*

* cited by examiner

Primary Examiner—Michael B Shingleton
(74) Attorney, Agent, or Firm—Shimokaji I Fritz LLP

(57) ABSTRACT

A system for recovering and demodulating a carrier includes a carrier recovery loop and a data detector. The carrier recovery loop receives the carrier as an input and produces a recovered carrier at a frequency approximately equal to that of the carrier. The carrier recovery loop includes a downconverting mixer, a x5 multiplier, a x4 multiplier, and a phase locked loop. The downconverting mixer receives the carrier input, and the phase locked loop provides a VCO reference frequency through the x5 multiplier to the downconverting mixer, which provides a frequency shifted signal. The frequency shifted signal is passed through the x4 multiplier as input to the phase locked loop. The data detector receives the carrier and the recovered carrier as inputs and uses the recovered carrier to demodulate the carrier and detect I channel data and Q channel data.

33 Claims, 5 Drawing Sheets

QPSK AND 16 QAM SELF-GENERATING SYNCHRONOUS DIRECT DOWNCONVERSION DEMODULATOR

BACKGROUND OF THE INVENTION

The present invention generally relates to high frequency, high data rate communication systems and, more particularly, to demodulation for band efficient quadrature phase shift keying (QPSK) modulation and quadrature amplitude modulation (QAM) using monolithic microwave integrated circuits (MMIC).

The present invention is applicable to bandwidth efficient modulation communication systems. The invention provides a non-wired approach for high data rate needs, for example, in satellite to satellite communication, satellite to ground communication, terrestrial relay links for line-of-sight, demod/remod systems, and space based demod/remod systems.

The purpose of a demodulator is to perform waveform recovery. The best demodulator will recover the baseband pulse with the best signal to noise ratio (SNR). The error degradation in the signals can be caused by two most prominent sources. One most prominent source is inter-symbol interference (ISI). The filtering used to reject unwanted parts of the signal and noise can cause a non-ideal system transfer causing ISI. The ISI distorts the signal and will produce errors in the received signal. The other most prominent source of degradation is due to noise from electrical sources, atmospheric effects, thermal effects, and inter-modulation products, for example. The demodulator should undistort, or correct distortion of, the pulse to give the best possible received signal.

Conventional modulation systems consist of a modulator operated at an intermediate frequency (IF) and a number of filters, amplifiers and mixers that up convert the modulated signal to the transmit frequency, also called the carrier frequency. The wide band signal on the carrier is transmitted over a communication channel and received by a receiver. At the receiver, the wide band signal on the carrier is down converted to an IF channel and then demodulated. The IF channel may be optimized for the control of noise sources to allow increases in data rates and improve link margins. Down conversion of the wide band signals to optimized IF channels may cause phase errors to be introduced into the data that induce increases in the bit error rate of the communication channel. A significant problem for bandwidth efficient modulation and demodulation is achieving low amplitude and phase error.

An example of QPSK modulation is illustrated by the block diagram of FIG. 1, where two-bit data word 102 and carrier 104 are input to phase modulator 100, which outputs QPSK modulated carrier 106 corresponding to a signal, S, of the form:

$$S(t)=A\cos(\omega_s t-\theta+\psi) \quad (1)$$

where A is the carrier amplitude constant and $\psi$ is the phase constant. There are four possible values for two-bit data word 102. Phase modulator 100 maps each of the four possible values for two-bit data word 102 to a distinct value of the phase angle $\theta$.

The QPSK modulated carrier 106 output from phase modulator 100 may be represented on a phase diagram such as phase diagram 200 seen in FIG. 2. Phase diagram 200 shows that phase angle $\theta$ will take on the form of one of four phases separated by 90 degrees. As shown in FIG. 2, each of the four possible values of two-bit data word 102 is represented by a symbol 202, which is a point, or vector, $s_1$, $s_2$, $s_3$ or $s_4$, in the phase plane of phase diagram 200. Two bits of information, or one symbol, is sent every word time corresponding to one of the four vectors, or symbols, in phase diagram 200.

The symbols of a QPSK signals may also be conceptualized as two pairs of a bi-orthogonal set. FIG. 3 shows a common implementation, using that concept, of QPSK modulator 300 employing orthogonal bi-phase shift keying (BPSK) modulators 310 and 320. The circuit of QPSK modulator 300 shown in FIG. 3 uses double-balanced mixers for BPSK modulators 310 and 320. As seen in FIG. 3, two-bit data word 302 is extracted from bit sequences 303 and 305. Bit sequence 303 and carrier 314 are input to BPSK modulator 310, which outputs BPSK modulated signal 316. Bit sequence 305 and carrier 324 are input to BPSK modulator 320, which outputs BPSK modulated signal 326. BPSK modulated signals 316 and 326 are added by summer 330 and output as QPSK modulated carrier 336 corresponding to a signal, S, of the form:

$$S(t)=A\cos(\omega_s t-\theta+\psi) \quad (2)$$

where A is the carrier amplitude constant and $\psi$ is the phase constant. There are four possible values for two-bit data word 302 each of which is mapped to a distinct value of the phase angle $\theta$. Because carriers 314 and 316 differ in phase by 90 degrees, phase angle $\theta$ will take on one of four phase values separated by 90 degrees, as shown in FIG. 2, with each of the four possible values of two-bit data word 302 represented by a symbol 202, which is a vector, $s_1$, $s_2$, $s_3$ or $s_4$, in the phase plane of phase diagram 200.

FIG. 4 shows how two QPSK modulation systems 410 and 420 may be combined in a QAM modulation system 400 to achieve a 16 QAM signal 436. A radio frequency (RF) or IF carrier is provided by local oscillator 404 using timing reference 401, as known in the art. The RF or IF carrier is split into carriers 414 and 424, and each is fed into QPSK modulation systems 410 and 420, respectively. Two-bit data word 412, which includes bits $b_0$ and $b_1$ as shown in FIG. 4, and carrier 414 are input to QPSK modulation system 410. QPSK modulation system 410 outputs QPSK modulated carrier 416 corresponding to a signal which may be represented, as described above in connection with FIG. 2, by vectors 516 on phase diagram 510 shown in FIG. 5. Similarly, two-bit data word 422, which includes bits $b_2$ and $b_3$ as shown in FIG. 4, and carrier 424 are input to QPSK modulation system 420. QPSK modulation system 420 outputs a QPSK modulated carrier 426, which travels through attenuator 427. Attenuator 427 lowers the amplitude of QPSK modulated carrier 426. The attenuated QPSK modulated carrier 426 corresponds to a signal which may be represented, as described above in connection with FIG. 2, by vectors 526 on phase diagram 520 shown in FIG. 5.

As seen in FIG. 4, the two QPSK modulated carriers 416 and 426 are added by summer 430 and output as QAM modulated carrier 436 corresponding to a signal which may be represented, as described above in connection with FIG. 2, by vectors 536 on phase diagram 530 shown in FIG. 5. The addition of QPSK modulated carriers 416 and 426 is indicated in FIG. 5 by plus sign 532 and equal sign 534 representing addition of phase diagrams 510 and 520 corresponding to QPSK modulated carriers 416 and 426, respectively. Because each vector 516 and 526 represents a signal, addition of the phase diagrams is accomplished by adding each possible pair of vectors 516 and 526 to produce a vector or symbol 536 in phase diagram 530. The configuration formed by symbols 536 is referred to as a 16 QAM constellation. The vectors 516 are also shown in phase diagram 530 to provide a size orientation for the purposes of illustration only, but do not form part of the 16 QAM constellation illustrated in phase diagram 530. Each symbol 536 represents a pair of two-bit data words 412 and 422, which may be viewed as a four-bit data word, $b_0$, $b_1$, $b_2$, $b_3$. Each four-bit data word has 16 possible values each of which is mapped by QAM modulation system 400 to one distinct symbol 536 of the 16 symbols 536.

Physical limitations and variances in the circuits used to implement QAM modulation system 400 cause variance, or inexactitude, in the amplitudes and phases of symbols 536 during transmission of the QAM modulated signal. The variances may cause some of the symbols 536 to occasionally be transmitted closer together in phase diagram 530. In other words, the amplitude and phase of two different symbols could begin to overlap, which may be referred to as inter-symbol interference. If the variances, or inter-symbol interference, are too great, the receiver may not be able to reliably provide resolution of the symbols to permit faithful demodulation of the QAM modulated signal at the receiver. Inter-symbol interference, which limits the effectiveness of QAM modulation systems, may be reduced by achieving low amplitude and phase error over the channel bandwidth. The technical difficulties in achieving low amplitude and phase error over the channel bandwidth have restricted the use of QAM modulation systems to lower frequencies and narrower bandwidths than is desirable. Introduction of amplitude and phase error is a significant problem in the demodulation of signals as well as in the modulation of signals, and, for example, may be associated in the receiver, as described above, with the down conversion of signals to IF.

As can be seen, there is a need in communication systems for demodulation that reduces amplitude and phase error, thus allowing higher data rates relative to the carrier frequency. There is also a need in communication systems for demodulation that achieves low amplitude and phase error over a wide bandwidth, thus improving overall performance by lowering the bit error rate of the communication channel.

SUMMARY OF THE INVENTION

The present invention provides, in communication systems, demodulation that reduces amplitude and phase error, and allows higher data rates relative to the carrier frequency. The present invention also provides, in communication systems, demodulation that achieves low amplitude and phase error over a wide bandwidth, and improves overall performance of the communication system measured by the bit error rate of the system.

In one aspect of the present invention, a system for recovering and demodulating a carrier includes a carrier recovery loop, which receives the carrier as an input and produces a recovered carrier at a frequency approximately equal to that of the carrier; and a data detector, which receives the carrier and the recovered carrier as inputs and uses the recovered carrier to demodulate the carrier and detect I channel data and Q channel data.

In another aspect of the present invention, a system for recovering and demodulating a carrier includes a carrier recovery loop and a data detector. The carrier recovery loop receives the carrier as an input and produces a recovered carrier at a frequency approximately equal to that of the carrier. The carrier recovery loop includes a downconverting mixer, a ×5 multiplier, a ×4 multiplier, and a phase locked loop. The downconverting mixer receives the carrier input, and the phase locked loop provides a VCO reference frequency through the ×5 multiplier to the downconverting mixer, which provides a frequency shifted signal. The frequency shifted signal is passed through the ×4 multiplier as input to the phase locked loop. The data detector receives the carrier and the recovered carrier as inputs and uses the recovered carrier to demodulate the carrier and detect I channel data and Q channel data.

In still another aspect of the present invention, a system for recovering and demodulating a carrier includes a carrier recovery loop, which receives the carrier as an input and produces a recovered carrier at a frequency approximately equal to that of the carrier. The carrier recovery loop includes a downconverting mixer, a ×5 multiplier, a ×4 multiplier, and a phase locked loop. The downconverting mixer receives the carrier as one input, and the phase locked loop provides a VCO reference frequency through the ×5 multiplier to the downconverting mixer as the other input. Using the VCO output to do the downconversion reduces the number of sources of phase noise and the VCO output is coherent so the amount of phase noise is reduced. The VCO reference frequency is approximately one quarter the carrier frequency, and the ×5 multiplier upconverts the VCO reference frequency by a factor of five and feeds the upconverted VCO reference frequency as the other input to the downconverting mixer. Based on its inputs, the downconverting mixer provides a frequency shifted signal, whose frequency is approximately one quarter the carrier frequency, which is passed through the ×4 multiplier. The ×4 multiplier upconverts the frequency shifted signal by a factor of four and feeds the upconverted frequency shifted signal as input to the phase locked loop.

The phase locked loop includes a phase detector, a loop filter, a VCO, and another ×4 multiplier. The VCO provides the VCO reference frequency to the phase locked loop's ×4 multiplier, which produces an upconverted VCO reference frequency to provide the recovered carrier. The phase detector compares the upconverted frequency shifted signal to the upconverted VCO reference frequency in order to drive a loop filter, which provides a control voltage to the VCO.

The system also includes a phase adjuster. The recovered carrier is passed through the phase adjuster to provide a phase adjusted recovered carrier. The phase adjuster matches the phase of the phase adjusted recovered carrier to the phase of the carrier.

The system lastly includes a data detector, which receives the wideband carrier signal and the phase adjusted recovered carrier as inputs and uses the phase adjusted recovered carrier to demodulate the carrier and detect I channel data and Q channel data. The wideband carrier signal and the phase adjusted recovered carrier must have the same phase variation going into the data detector for the best detection of I and Q channel data. The data detector has a first mixer, which uses the carrier and the phase adjusted recovered carrier to detect the I channel data; a second mixer and a phase shifter, where the phase adjusted recovered carrier is fed to the second mixer via the phase shifter, so that the second mixer uses the carrier and the phase shifted, phase adjusted, recovered carrier to detect the Q channel data. The data detector also has a first post detection filter, the output of the first mixer being passed through the first post detection filter to reproduce the I channel data, and a second post detection filter, the output of the second mixer being passed through the second post detection filter to reproduce the Q channel data.

In a further aspect of the present invention, a method for demodulating a carrier includes steps of down converting the carrier to produce a frequency shifted signal; feeding the frequency shifted signal to a phase locked loop; using the phase locked loop to produce a recovered carrier, where the recovered carrier has a frequency approximately equal to that of the carrier; adjusting the phase of the recovered carrier to produce a phase adjusted recovered carrier; providing the carrier and the phase adjusted recovered carrier to a data detector; and demodulating the carrier and detecting I channel data and Q channel data using the data detector.

These and other features, aspects and advantages of the present invention will become better understood with reference to the following drawings, description and claims.

DETAILED DESCRIPTION OF THE INVENTION

Figure 2:
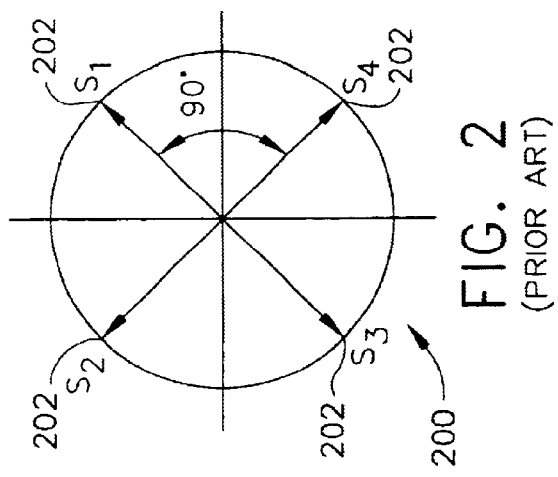
FIG. 2 is a phase diagram for a typical implementation of QPSK modulation.
Figure 1:
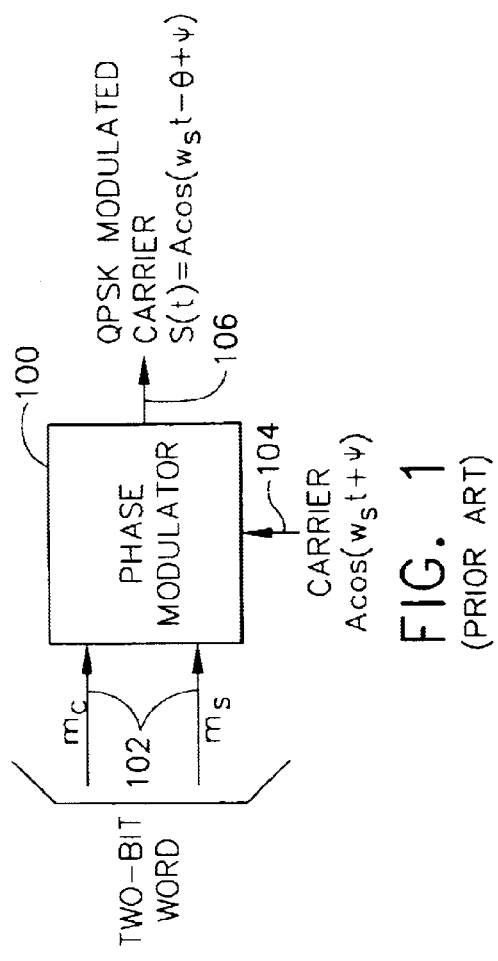
FIG. 1 is a block diagram for a typical implementation of quadrature phase shift keying (QPSK) modulation.
Figure 3:
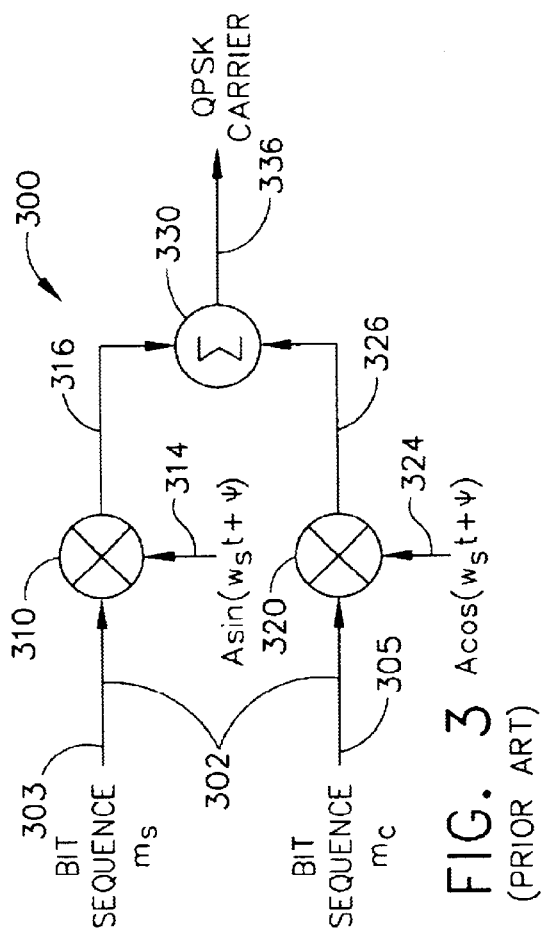
FIG. 3 is a block diagram for QPSK modulation as typically implemented using bi-phase shift keying (BPSK)
Figure 4:
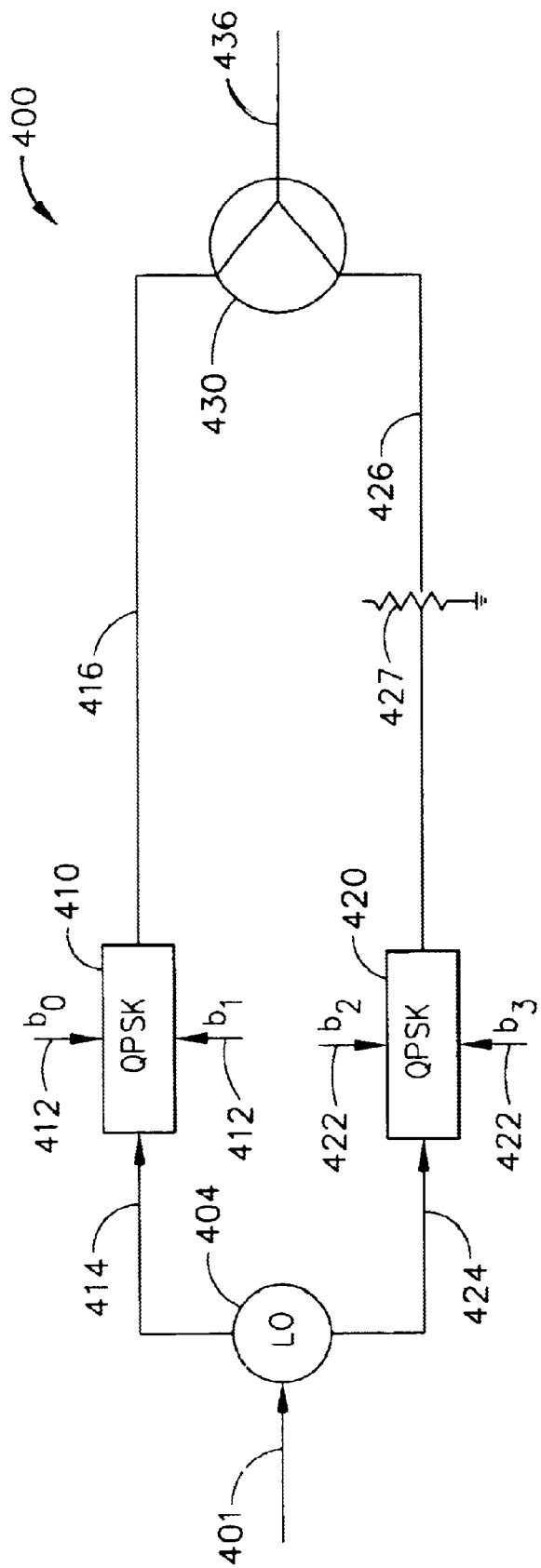
FIG. 4 is a block diagram of quadrature amplitude modulation (QAM) as typically implemented using QPSK.

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention provides, in communication systems, demodulation that reduces amplitude and phase error, and allows higher data rates relative to the carrier frequency. The present invention may use monolithic microwave integrated circuits (MMIC) or application specific integrated circuits (ASIC) to directly, i.e., without wideband down conversion to an intermediate frequency (IF), demodulate a microwave carrier modulated at high data rates in a quadrature phase shift keying (QPSK) format or a quadrature amplitude modulation (QAM) format. The method of direct demodulation in an embodiment of the present invention enables the use of increased data rate and provides a more bandwidth-efficient transmission and reception of data, rendering an economic advantage where spectrum allocations are limited. In one embodiment, the present invention may reduce required hardware and operating costs.

The present invention also provides, in communication systems, demodulation that achieves low amplitude and phase error—or imbalance—over a wide bandwidth, and improves overall performance of the communication system exhibited by, for example, low inter-symbol interference and low bit error rate of the system. In one embodiment, a wireless telecommunication system using the demodulation of the present invention exhibits an amplitude and phase imbalance of less than plus or minus 0.3 dB and 2 degrees respectively over a 6 GHz bandwidth. In one embodiment, a communication system is capable of delivering approximately 5 Gbps of data using a 16 QAM modulation and demodulation. Unlike prior art QAM systems, which are unable to achieve comparable levels of performance, the 16 QAM modulation and demodulation may be achieved as a direct result of the benefits of a QPSK MMIC implemented to operate at high switching speeds with improved vector, i.e., amplitude and phase, performance.

Unlike the prior art, where no method to eliminate or reduce the phase errors induced by down conversion has been seen, the present invention eliminates the need for a wideband down conversion to an IF frequency. Down conversion to an IF frequency is typically implemented in the prior art to reduce the frequency of the wideband carrier signal to a frequency where conventional ×4 recovery loops can operate and where conventional data detectors are more easily realizable. One embodiment of the present invention is unique, i.e. differs from the prior art, in that it relies on a standard times 4 carrier recovery scheme without the need for a phase detection at four times the carrier frequency (above 40 GHz in this embodiment). In this embodiment, the demodulator allows for demodulation of a data signal, either QPSK or 16 QAM modulated, transmitted over a communication channel at, for example, 20 GHz center frequency without the need for phase detection at 80 GHz. Demodulation is accomplished by an internal coherent down conversion of the incoming signal to generate a recovered carrier while still maintaining baseband data detection at 20 GHz. This is possible by using a voltage controlled oscillator (VCO) output to downconvert the signal, which differs from the prior art in that the VCO output is a coherent source so the amount of phase noise is less than would be experienced using a separate local oscillator (LO). This approach for carrier recovery and baseband data detection offers improved overall performance by eliminating the need for a wideband down conversion to an IF frequency, as required for the operation of conventional ×4 recovery loops and easily realizable data detectors.

Figure 5:
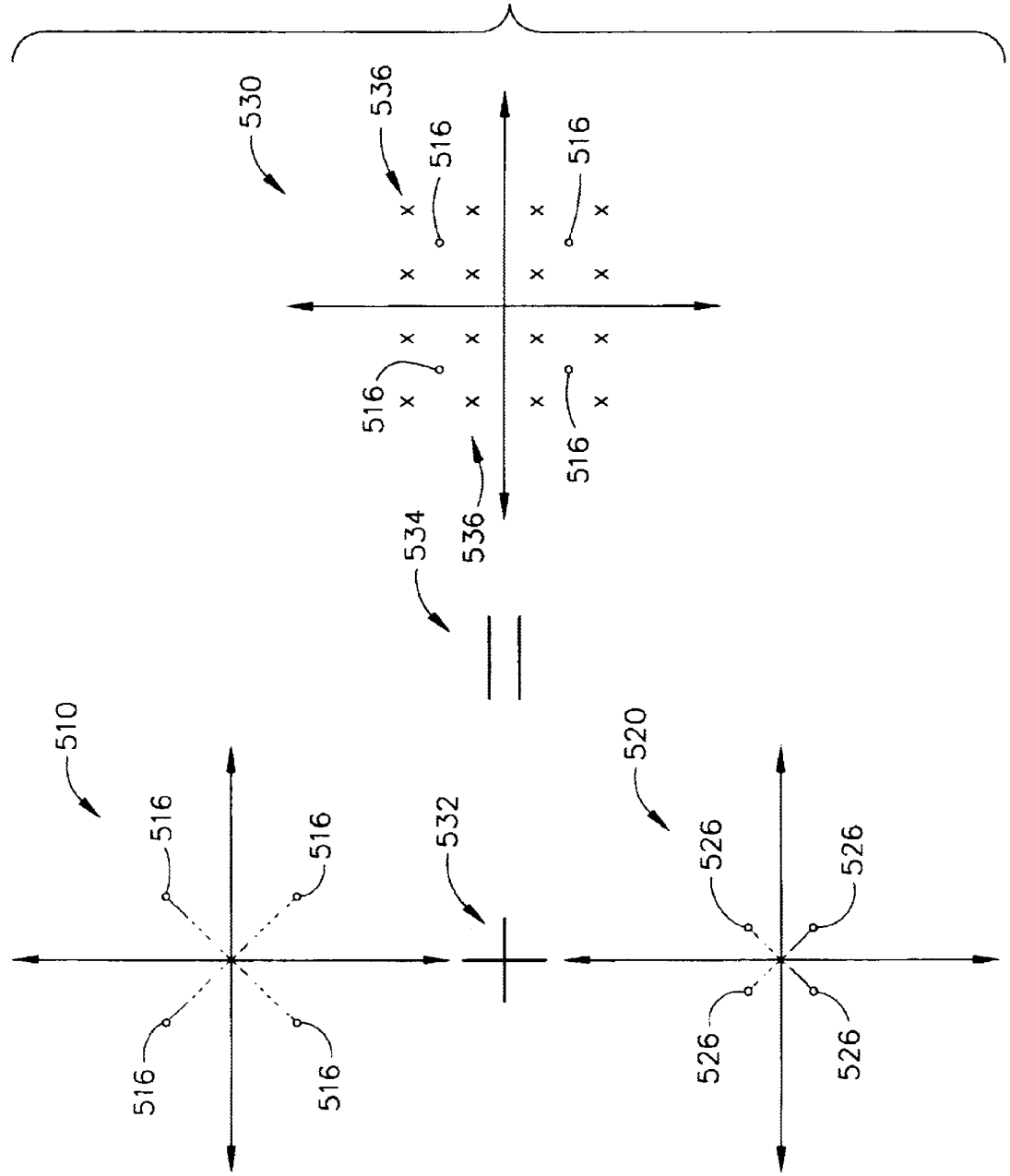
FIG. 5 is a group of phase diagrams illustrating the implementation of QAM as typically implemented using QPSK.
Figure 6:
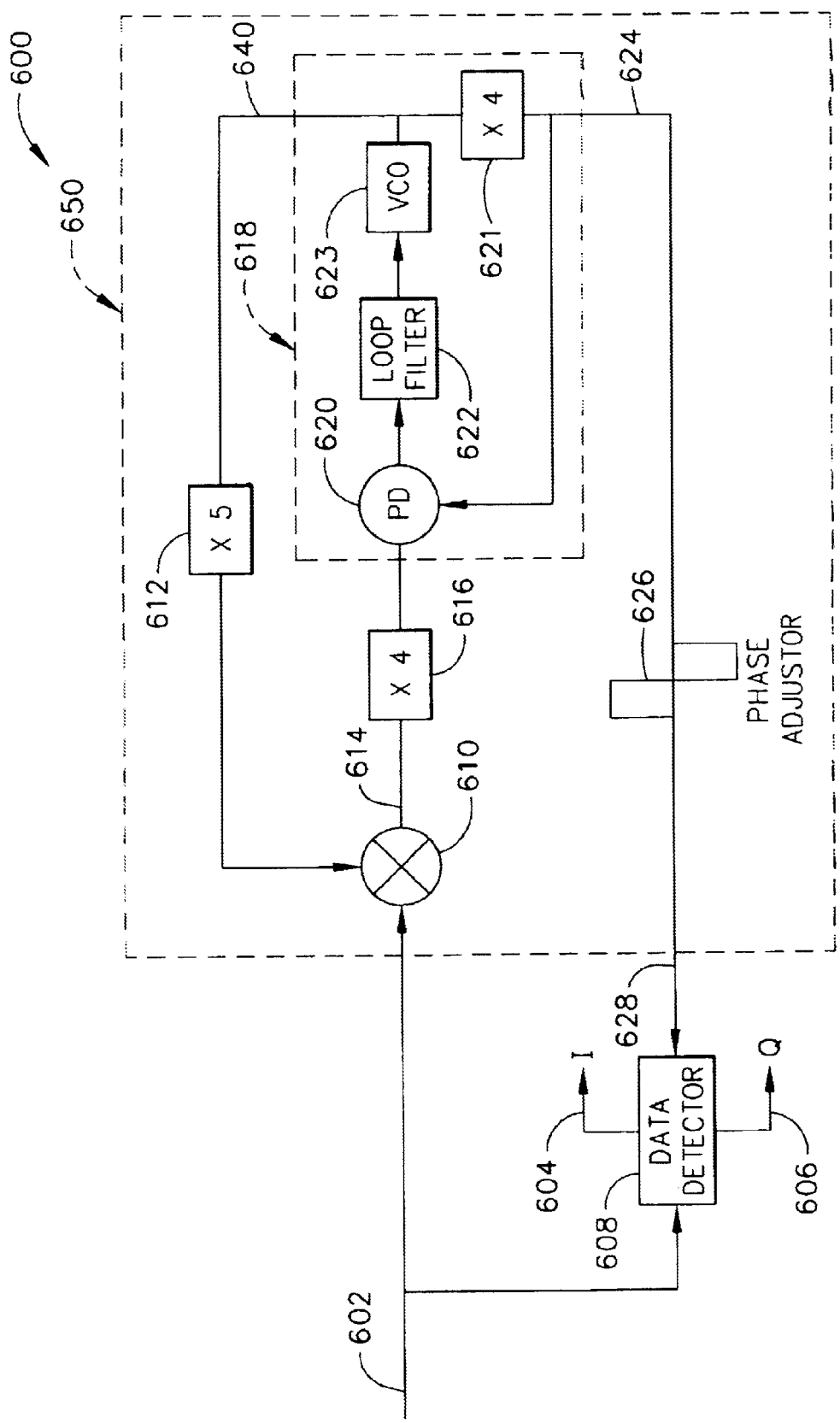
FIG. 6 is a high-level functional block diagram of a demodulator, according to an embodiment of the present invention.

Referring now to FIG. 6, demodulator 600 is illustrated according to one embodiment. Demodulator 600 may be implemented in MMIC or ASIC to improve the high frequency operation, and low amplitude and phase error of demodulator 600. The function of demodulator 600 is to demodulate a wideband signal on carrier 602, reproducing data bit information as I channel data 604 and Q channel data 606, from which can be decoded the vector state or symbol information of the data, as generally described above. For example, the vector representation of the data may be illustrated using a phase diagram similar to phase diagram 200 of FIG. 2, or phase diagram 530 of FIG. 5, in which I channel data 604 corresponds to a horizontal axis of the diagram and Q channel data 606 corresponds to a vertical axis of the diagram.

Continuing with FIG. 6, carrier 602, which, in the present example for illustration of one embodiment, may be a radio frequency (RF) carrier at a frequency of approximately 20 GHz, is input to data detector 608 and also to down converting mixer 610. Down converting mixer 610 may receive a second input from ×5 multiplier 612, which provides a signal at a frequency of approximately 5/4 times the frequency of carrier 602. Thus, down converting mixer 610, which can output a signal whose frequency is the difference of its two input frequencies, effectively shifts down the frequency of the incoming signal on carrier 602, and outputs frequency shifted signal 614 at one quarter the frequency of carrier 602.

In this embodiment, there is a ×5 function. This is not strictly a multiplication function. When a signal is turned into a square wave there are third, fifth, seventh, etc., harmonics that are generated during the conversion processes. "Multiplier" is the common name used when in actuality the multiplier does not multiply the signal. The multiplier converts the signal into a square wave and will filter the harmonic that is required. When a ×5 multiplier is used, the fifth harmonic is filtered out. This fifth harmonic is located at five times the original frequency. This is where the common name "multiplier" comes from. The multiplier provides the fifth harmonic that is at a frequency five times the original signal's frequency.

In this embodiment, there is also a ×4 function. The ×4 function may work differently than the ×5 function. For example, the ×4 function may break down to a ×2*×2 function. A way to describe the ×2 function is using the square law modulator. This law square takes the data s(t) and the carrier $s_c(t)$ and squares the sum which will mathematically produce 2 times the carrier frequency, as illustrated by the following equation:

$$[s(t)+s_c(t)]^2 = s(t)^2 + s_c(t)^2 + 2s(t)s_c(t) \qquad (3).$$

To perform the ×2 function the signal $[s(t)+s_c(t)]$ is split off so two equal signals are entering the mixer, but with 90 degrees difference in phase. When the two frequencies are mixed together, they are added together giving the $2s(t)s_c(t)$ term in equation (3).

Frequency shifted signal 614 may be passed through ×4 multiplier 616, which upconverts frequency shifted signal 614 to approximately the frequency of carrier 602, and fed to phase detector 620. Phase detector 620 compares the signal from ×4 multiplier 616 to the signal from ×4 multiplier 621 in order to drive loop filter 622. Loop filter 622 provides a control voltage to the voltage controlled oscillator, VCO 623. VCO 623 produces an output signal, referred to as VCO reference 640. VCO reference 640 has a frequency, referred to as the VCO reference frequency, approximately equal to one quarter of the incoming RF signal frequency of carrier 602. Thus, VCO 623 may provide a signal, VCO reference 640, at a frequency, the VCO reference frequency, approximately one quarter the frequency of carrier 602, to ×5 multiplier 612 and also to ×4 multiplier 621. VCO reference 640 may be upconverted by ×4 multiplier 621 to approximately the frequency of carrier 602, and fed to phase detector 620. VCO reference 640 also may be upconverted by ×5 multiplier 612 to five times the VCO reference frequency, i.e., approximately 5/4 times the frequency of carrier 602, and fed to down converting mixer 610.

Phase locked loop 618 may comprise phase detector 620, loop filter 622, VCO 623, and ×4 multiplier 621. Phase locked loop 618 may provide one signal, i.e., VCO reference 640, at a VCO reference frequency approximately one quarter the frequency of carrier 602 through ×5 multiplier 612 to downconverting mixer 610. Phase locked loop 618 may also provide a signal, i.e., recovered carrier 624, at a frequency approximately equal to the frequency of carrier 602. Recovered carrier 624 may be fed to phase adjuster 626. Phase adjustor 626 adjusts the phase of recovered carrier 624 to match the phase of carrier 602, outputting phase adjusted recovered carrier 628.

Thus, demodulator 600 may be conceptually divided into a carrier recovery loop 650 and a data detector 608. Carrier recovery loop 650 may include downconverting mixer 610, ×5 multiplier 612, ×4 multiplier 616, phase locked loop 618, and phase adjuster 626. Carrier 602 may be received as input by carrier recovery loop 650, and carrier recovery loop 650 may provide a recovered carrier, in the form of recovered carrier 624 or phase adjusted recovered carrier 628, as output. Carrier 602 and phase adjusted recovered carrier 628 may be fed as inputs to data detector 608. Data detector 608 may use phase adjusted recovered carrier 628 to demodulate carrier 602, as known in the art, and reproduce, or detect, I channel data 604 and Q channel data 606.

Figure 7:
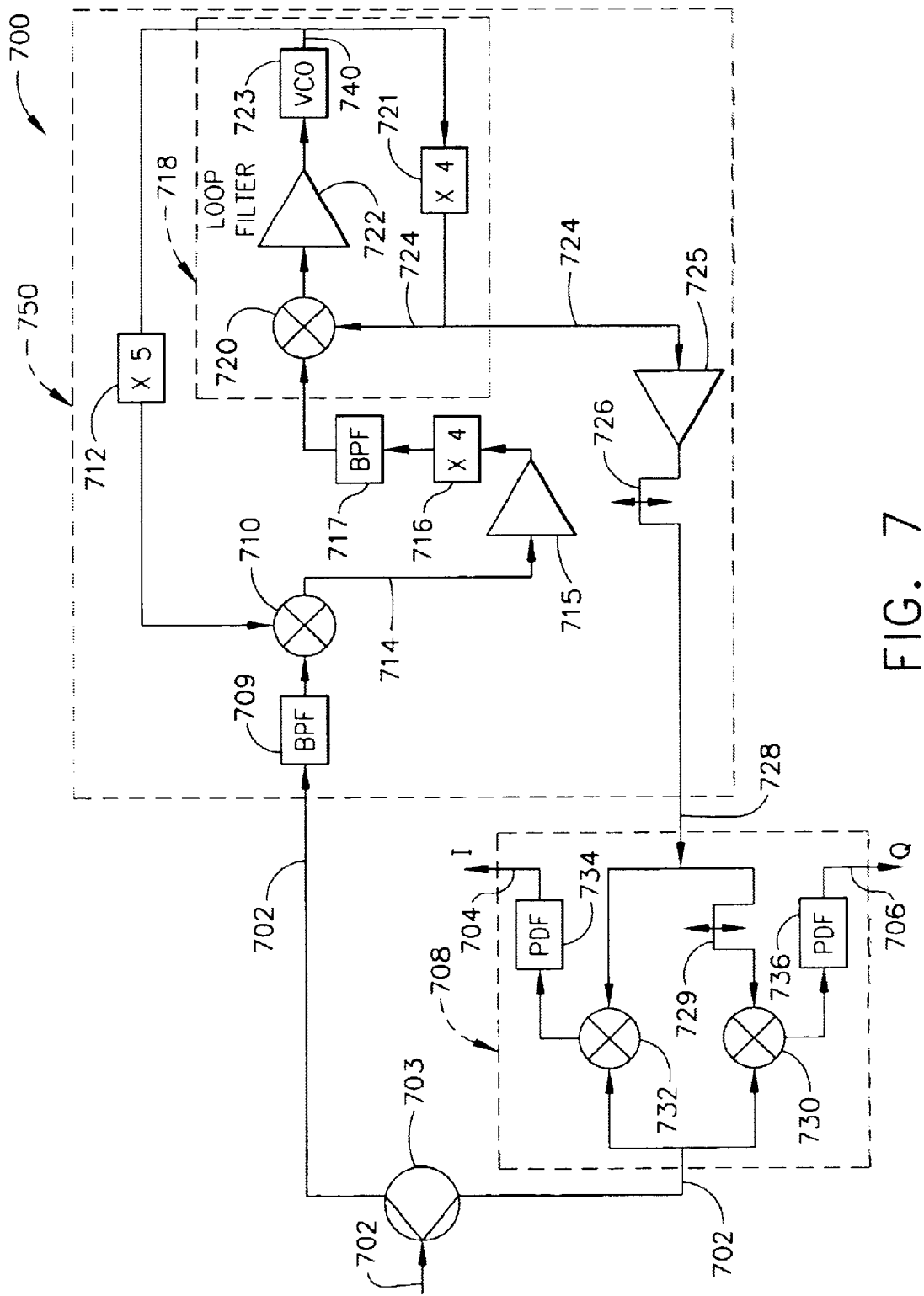
FIG. 7 is a more detailed block diagram of a demodulator, according to an embodiment of the present invention.

Referring now to FIG. 7, demodulator 700 is illustrated according to one embodiment. Demodulator 700 may be implemented in MMIC or ASIC to improve the high frequency operation, and low amplitude and phase error of demodulator 700. The function of demodulator 700 is to demodulate a wideband signal on carrier 702, reproducing data bit information as I channel data 704 and Q channel data 706, from which can be decoded the vector state or symbol information of the data, as generally described above. For example, the vector representation of the data may be illustrated using a phase diagram similar to phase diagram 200 of FIG. 2, or phase diagram 530 of FIG. 5, in which I channel data 704 corresponds to a horizontal axis of the diagram and Q channel data 706 corresponds to a vertical axis of the diagram.

Continuing with FIG. 7, carrier 702, which, in the present example for illustration of one embodiment, may be an RF carrier at a frequency of approximately 20 GHz, may be input to signal splitter 703 of demodulator 700. Signal splitter 703 splits carrier 702 into two equal amplitude signals and feeds carrier 702 into data detector 708 and also to band pass filter 709. Band pass filter 709 may remove any undesirable high or low frequency components from carrier 702, i.e., "clean up" carrier 702, before passing carrier 702 to down converting mixer 710 as a first input. Down converting mixer 710 may receive a second input from ×5 multiplier 712, which provides a signal at a frequency of approximately 5/4 times the frequency of carrier 702. Thus, down converting mixer 710, which can output a signal whose frequency is the difference of its two input frequencies, effectively shifts down the frequency of the incoming signal on carrier 702, and outputs frequency shifted signal 714 at one quarter the frequency of carrier 702. Frequency shifted signal 714 may be amplified by amplifier 715 and passed through ×4 multiplier 716, which frequency shifts the signal 714 to approximately the frequency of carrier 602, also referred to as the carrier frequency. The frequency shifted, upconverted signal may then be fed to band pass filter 717 to produce a clean signal at the carrier frequency. The clean signal at the carrier frequency may then be passed to phase locked loop 718 as input to phase detector 720. Phase locked loop 718 may include phase detector 720, ×4 multiplier 721, loop filter 722, and VCO 723.

In normal operation of phase locked loop 718, phase detector 720 compares the clean signal from band pass filter 717 to the signal from ×4 multiplier 721 and drives loop filter 722. Loop filter 722 provides a control voltage to VCO 723. VCO 723 produces an output signal, referred to as VCO reference 740. VCO reference 740 has a frequency, referred to as the VCO reference frequency, approximately equal to one quarter of the RF input signal frequency of carrier 702. Thus, VCO 723 may provide a signal, VCO reference 740, at a frequency, the VCO reference frequency, approximately one quarter the frequency of carrier 702, to ×5 multiplier 712 and also to ×4 multiplier 721. VCO reference 740 may be upconverted by ×4 multiplier 721 to approximately the frequency of carrier 702 producing recovered carrier 724. Recovered carrier 724 may be fed to phase detector 720 and to amplifier 725. VCO reference 740 also may be upconverted by ×5 multiplier 712 to five times the VCO reference frequency, i.e., approximately 5/4 times the frequency of carrier 702, and used as the local oscillator (LO) signal for down converting mixer 710. Thus, the frequency of VCO 723 may be controlled by phase detector 720 and loop filter 722 so that phase locked loop 718 is stabilized and locked onto the carrier frequency.

In brief, phase locked loop 718 may provide a signal, i.e., VCO reference 740, at VCO reference frequency approximately one quarter the frequency of carrier 702 through ×5 multiplier 712 to downconverting mixer 710. Phase locked loop 718 may also provide a signal, i.e. recovered carrier 724, at a frequency approximately equal to the frequency of carrier 702, and which may track the frequency of carrier 702. Recovered carrier 724 may be passed through amplifier 725 and fed to phase adjuster 726. Phase adjustor 726 adjusts the phase of recovered carrier 724 to match the phase of carrier 702, outputting phase adjusted recovered carrier 728.

Thus, demodulator 700 may be conceptually divided into a carrier recovery loop 750 and a data detector 708. Carrier recovery loop 750 may include band pass filter 709, downconverting mixer 710, ×5 multiplier 712, amplifier 715, ×4 multiplier 716, band pass filter 717, phase locked loop 718, amplifier 725, and phase adjuster 726. Carrier 702 may be received as input by carrier recovery loop 750, and carrier recovery loop 750 may provide a recovered carrier, in the form of recovered carrier 724 or phase adjusted recovered carrier 728, as output.

Carrier 702 and phase adjusted recovered carrier 728 may be received as inputs by data detector 708. Data detector 708 may comprise phase shifter 729, mixers 730 and 732, and post detection filters 734 and 736. Data detector 708 may use phase adjusted recovered carrier 728 to demodulate carrier 702, as known in the art. For example, as seen in FIG. 7, the wideband signal on carrier 702 may be fed to mixers 730 and 732. Phase adjusted recovered carrier 728 may also be fed to mixer 732 for data detection and the output of mixer 732 may be passed through post detection filter 734 to reproduce I channel data 704. Phase adjusted recovered carrier 728 may also be fed to mixer 730 via phase shifter 729. Phase shifter 729 may, for example, produce a 90-degree phase shift in phase adjusted recovered carrier 728 to facilitate recovery, or detection, of the quadrature, or Q channel, data information by mixer 730. The output of mixer 730 may be passed through post detection filter 736 to reproduce Q channel data 706.

It should be understood, of course, that the foregoing relates to preferred embodiments of the invention and that modifications may be made without departing from the spirit and scope of the invention as set forth in the following claims.

We claim:

1. A system for recovering and demodulating a carrier, comprising:
   a carrier recovery loop receiving the carrier as an input, said carrier recovery loop producing a recovered carrier at a frequency approximately equal to that of the carrier; and
   a data detector, said data detector receiving the carrier and said recovered carrier as inputs and using said recovered carrier to demodulate the carrier and detect I channel data and Q channel data wherein:
   said carrier recovery loop comprises a downconverting mixer, a ×5 multiplier, a ×4 multiplier, and a phase locked loop, and wherein said downconverting mixer receives the carrier as an input, said phase locked loop provides a VCO reference frequency through said ×5 multiplier to said downconverting mixer, said downconverting mixer provides a frequency shifted signal, and said frequency shifted signal is passed through said ×4 multiplier to said phase locked loop.

2. The system of claim 1 wherein said phase locked loop comprises a phase detector, a loop filter, a VCO, and a ×4 multiplier, and wherein said VCO provides a VCO reference frequency to said ×4 multiplier, said ×4 multiplier produces an upconverted VCO reference frequency to provide said recovered carrier, said phase detector compares an upconverted frequency shifted signal to said upconverted VCO reference frequency and drives said loop filter, and said loop filter provides a control voltage to said VCO.

3. The system of claim 1 wherein said frequency shifted signal has a frequency and the carrier has a carrier frequency, said frequency of said frequency shifted signal is approximately one quarter said carrier frequency, and said ×4 multiplier upconverts said frequency shifted signal by a factor of four.

4. The system of claim 1 wherein the carrier has a carrier frequency, said VCO reference frequency is approximately one quarter said carrier frequency, and said ×5 multiplier upconverts said VCO reference frequency by a factor of five.

5. The system of claim 1, further comprising a phase adjuster, wherein said recovered carrier is passed through said phase adjuster to provide a phase adjusted recovered carrier and said data detector receives the carrier and said phase adjusted recovered carrier as inputs.

6. The system of claim 5 wherein the carrier and said phase adjusted recovered carrier each have a phase and said phase adjuster matches said phase of said phase adjusted recovered carrier to said phase of the carrier.

7. The system of claim 5 wherein said data detector comprises a first mixer, said first mixer using the carrier and said phase adjusted recovered carrier to detect said I channel data.

8. The system of claim 7 wherein said data detector comprises a second mixer and a phase shifter, said phase adjusted recovered carrier feeding to said second mixer via said phase shifter, and said second mixer using the carrier and said phase adjusted recovered carrier to detect said Q channel data.

9. The system of claim 7 wherein said data detector comprises a first post detection filter, and an output or said first mixer is passed through said first post detection filter to reproduce said I channel data.

10. The system of claim 8 wherein said data detector comprises a second post detection filter, and an output of said second mixer is passed through said second past detection filter to reproduce said Q channel data.

11. The system of claim 1 wherein said system is fabricated using MMIC.

12. The system of claim 1 wherein said system is fabricated using ASIC.

13. A system for recovering and demodulating a carrier, comprising:
    a carrier recovery loop receiving the carrier as an input, said carrier recovery loop producing a recovered carrier at a frequency approximately equal to that of the carrier; wherein said carrier recovery loop comprises a downconverting mixer, a ×5 multiplier, a ×4 multiplier, and a phase locked loop, and wherein said downconverting mixer receives the carrier as an input, said phase locked loop provides a VCO reference frequency through said ×5 multiplier to said downconverting mixer, said downconverting mixer provides a frequency shifted signal, and said frequency shifted signal is passed through said ×4 multiplier to said phase locked loop; and a data detector, said data detector receiving the carrier and said recovered carrier as inputs and using said recovered carrier to demodulate the carrier and detect I channel data and Q channel data.

14. The system of claim 13 wherein said phase locked loop comprises a phase detector, a loop filter, a VCO, and a second ×4 multiplier, and wherein said VCO provides a VCO reference frequency to said second ×4 multiplier, said second ×4 multiplier produces an upconverted VCO reference frequency to provide said recovered carrier, said phase detector compares an upconverted frequency shifted signal to said upconverted VCO reference frequency and drives said loop filter, and said loop filter provides a control voltage to said VCO.

15. The system of claim 13 wherein:
the carrier has a carrier frequency and said frequency shifted signal has a frequency,
said frequency of said frequency shifted signal is approximately one quarter said carrier frequency, and said ×4 multiplier upconverts said frequency shifted signal by a factor of four; and
said VCO reference frequency is approximately one quarter said carrier frequency, and said ×5 multiplier upconverts said VCO reference frequency by a factor of five.

16. The system of claim 13, further comprising a phase adjuster, wherein said recovered carrier is passed through said phase adjuster to provide a phase adjusted recovered carrier and said data detector receives the carrier and said phase adjusted recovered carrier as inputs.

17. The system of claim 13 wherein the carrier and said phase adjusted recovered carrier each have a phase and said phase adjuster matches said phase of said phase adjusted recovered carrier to said phase of the carrier.

18. The system of claim 13 wherein said data detector comprises a first mixer, said first mixer using the carrier and said phase adjusted recovered carrier to detect said I channel data.

19. The system of claim 13 wherein said data detector comprises a second mixer and a phase shifter, said phase adjusted recovered carrier feeding to said second mixer via said phase shifter, and said second mixer using the carrier and said phase adjusted recovered carrier to detect said Q channel data.

20. The system of claim 13 wherein said data detector comprises a first post detection filter, and an output of said first mixer is passed through said first post detection filter to reproduce said I channel data.

21. The system of claim 13 wherein said data detector comprises a second post detection filter, and an output of said second mixer is passed through said second post detection filter to reproduce said Q channel data.

22. The system of claim 13 wherein said system is fabricated using MMIC.

23. The system of claim 13 wherein said system is fabricated using ASIC.

24. A system for recovering and demodulating a carrier, comprising:
a carrier recovery loop receiving the carrier as an input, said carrier recovery loop producing a recovered carrier at a frequency approximately equal to that of the carrier;
wherein said carrier recovery loop comprises a downconverting mixer, a ×5 multiplier, a first ×4 multiplier, and a phase locked loop, and wherein said downconverting mixer receives the carrier as an input, said phase locked loop provides a VCO reference frequency through said ×5 multiplier to said downconverting mixer, said downconverting mixer provides a frequency shifted signal, and said frequency shifted signal is passed through said first ×4 multiplier to said phase locked loop,
wherein said phase locked loop comprises a phase detector, a loop filter, a VCO, and a second ×4 multiplier, and wherein said VCO provides said VCO reference frequency to said second ×4 multiplier, said second ×4 multiplier produces an upconverted VCO reference frequency to provide said recovered carrier, said phase detector compares an upconverted frequency shifted signal to said upconverted VCO reference frequency and drives said loop filter, and said loop filter provides a control voltage to said VCO, and
wherein the carrier has a carrier frequency and said frequency shifted signal has a frequency, said frequency of said frequency shifted signal is approximately one quarter said carrier frequency, and said first ×4 multiplier upconverts said frequency shifted signal by a factor of four; and said VCO reference frequency is approximately one quarter said carrier frequency, and said ×5 multiplier upconverts said VCO reference frequency by a factor of five;
a phase adjuster, wherein said recovered carrier is passed through said phase adjuster to provide a phase adjusted recovered carrier, and wherein the carrier and said phase adjusted recovered carrier each have a phase and said phase adjuster matches the phase of said phase adjusted recovered carrier to the phase of the carrier; and
a data detector, said data detector receiving the carrier and said phase adjusted recovered carrier as inputs and using said phase adjusted recovered carrier to demodulate the carrier and detect I channel data and Q channel data,
wherein said data detector comprises a first mixer, said first mixer using the carrier and said phase adjusted recovered carrier to detect said I channel data, said data detector comprises a second mixer and a phase shifter, said phase adjusted recovered carrier feeding to said second mixer via said phase shifter, and said second mixer using the carrier and said phase adjusted recovered carrier to detect said Q channel data, said data detector comprises a first post detection filter, an output of said first mixer being passed through said first post detection filter to reproduce said I channel data, and said data detector comprises a second post detection filter, an output of said second mixer being passed through said second post detection filter to reproduce said Q channel data.

25. A method for demodulating a carrier having a carrier frequency, comprising steps of:
upconverting a VCO reference frequency by a factor of 5 to produce a signal at a frequency of approximately 5/4 times the carrier frequency;
mixing said signal at a frequency of approximately 5/4 times said carrier frequency with the carrier to down converting the carrier to produce a frequency shifted signal;
feeding said frequency shifted signal through a multiplier, said muliplier upconverting said frequency shifted signal by a factor of 4, to a phase locked loop;
using said phase locked loop to produce a recovered carrier, said recovered carrier having a frequency approximately equal to the carrier frequency, and said recovered carrier having a phase;

adjusting said phase of said recovered carrier to produce a phase adjusted recovered carrier;

providing the carrier and said phase adjusted recovered carrier to a data detector; and demodulating the carrier and detecting I channel data and Q channel data using said data detector.

26. The method of claim 25 wherein said step of using a phase locked loop further comprises steps of:

detecting a phase of said frequency shifted signal relative to a VCO reference frequency to drive a loop filter to provide a control voltage to a VCO; and controlling said VCO with said control voltage to provide said VCO reference frequency.

27. The method of claim 26 wherein:

said frequency shifted signal has a frequency and the carrier has a carrier frequency, said frequency of said frequency shifted signal is approximately one quarter said carrier frequency, said VCO reference frequency is approximately one quarter said carrier frequency, and said frequency shifted signal is upconverted to approximately the carrier frequency and said VCO reference frequency is upconverted to approximately the carrier frequency before said step of detecting a phase.

28. A method for demodulating a carrier having a carrier frequency, comprising steps of:

downconverting the carrier to produce a frequency shifted signal;

feeding said frequency shifted signal to a phase locked loop;

using said phase locked loop to produce a recovered carrier, said recovered carrier having a frequency approximately equal to the carrier frequency, and said recovered carrier having a phase, including steps of:

detecting a phase of said frequency shifted signal relative to a VCO reference frequency to drive a loop filter to provide a control voltage to a VCO; and controlling said VCO with said control voltage to provide said VCO reference frequency; wherein:

said frequency shifted signal has a frequency and the carrier has the carrier frequency, said frequency of said frequency shifted signal is approximately one quarter the carrier frequency, said VCO reference frequency is approximately one quarter the carrier frequency, said frequency shifted signal is upconverted to approximately the carrier frequency and said VCO reference frequency is upconverted to approximately the carrier frequency before said step of detecting a phase; and wherein said step of downconverting the carrier further comprises steps of:

upconverting said VCO reference frequency by a factor of five to produce a signal at a frequency of approximately 5/4 times said carrier frequency; and mixing said signal at a frequency of approximately 5/4 times said carrier frequency with the carrier;

adjusting said phase of said recovered carrier to produce a phase adjusted recovered carrier;

providing the carrier and said phase adjusted recovered carrier to a data detector; and demodulating the carrier and detecting I channel data and Q channel data using said data detector.

29. The method of claim 28 wherein the carrier and said phase adjusted recovered carrier each have a phase, and said adjusting step comprises matching the phase of said phase adjusted recovered carrier to the phase of the carrier.

30. The method of claim 28 wherein said data detector comprises a first mixer, and said first mixer uses the carrier and said phase adjusted recovered carrier to detect said I channel data.

31. The method of claim 30 wherein said data detector comprises a second mixer and a phase shifter, and said phase adjusted recovered carrier is fed to said second mixer via said phase shifter, and said second mixer uses the carrier and said phase adjusted recovered carrier to detect said Q channel data.

32. The method of claim 28 wherein said data detector comprises a first post detection filter, and an output of said first mixer is passed through said first post detection filter to reproduce said I channel data.

33. The method of claim 28 wherein said data detector comprises a second post detection filter, and an output of said second mixer is passed through said second post detection filter to reproduce said Q channel data.

* * * * *